United States Patent [19]
Sessions

[11] Patent Number: 5,828,249
[45] Date of Patent: Oct. 27, 1998

[54] ARRANGEMENT FOR SELECTIVE GENERATION OF AN OUTPUT SIGNAL RELATED TO A CLOCK SIGNAL AND METHOD THEREFOR

[75] Inventor: D. C. Sessions, Phoenix, Ariz.

[73] Assignee: VLSI Technology, Inc., San Jose, Calif.

[21] Appl. No.: 762,770

[22] Filed: Dec. 10, 1996

[51] Int. Cl.[6] .............................................. H03K 21/117
[52] U.S. Cl. ........................... 327/115; 327/117; 327/99; 327/299; 377/47
[58] Field of Search .................................. 327/115, 117, 327/118, 120, 121, 199, 201, 208, 214, 99, 291, 299; 377/47

[56] References Cited

U.S. PATENT DOCUMENTS

| 3,760,589 | 9/1973 | Fujita | 327/115 |
| 4,114,049 | 9/1978 | Suzuki | 327/212 |
| 4,464,586 | 8/1984 | Henning | 327/115 |
| 5,148,050 | 9/1992 | Koide | 327/203 |

FOREIGN PATENT DOCUMENTS

| 63-232615 | 9/1988 | Japan | 327/99 |
| 4-87415 | 3/1992 | Japan | 327/115 |

OTHER PUBLICATIONS

M. Afghahi, *A Robust Single Phase Clocking for Low Power, High–Speed VLSI Applications*, IEEE Journal of Solid–State Circuits, vol. 31, No. 2, Feb., 1996, pp. 247–254.
Richard X. Gu et al., *All–N–Logic High–Speed True– Single–Phase Dynamic CMOS Logic*, IEEE Journal of Solid–State Circuits, vol. 31, No. 2, Feb., 1996, pp. 221–229.
Jiren Yuan et al., *High–Speed CMOS Circuit Technique*, IEEE Journal of Solid–State Circuits, vol. 24, No. 1, Feb., 1989, pp. 62–69.

*Primary Examiner*—Timothy P. Callahan
*Assistant Examiner*—T. T. Lam
*Attorney, Agent, or Firm*—Merchant, Gould, Smith, Edell, Welter & Schmidt, P.A.

[57] ABSTRACT

A dynamic latching arrangement with a conditional driver, a system, and a method reduce power consumption, increase operating speed, and reduce the number of discrete components. The conditional driver selectively impresses a signal on an internal node of the circuit such that when a control signal is asserted, a signal related to the clock signal is generated, but when the control signal is not asserted, a different signal related to the clock signal is generated.

41 Claims, 5 Drawing Sheets

5,828,249

ARRANGEMENT FOR SELECTIVE GENERATION OF AN OUTPUT SIGNAL RELATED TO A CLOCK SIGNAL AND METHOD THEREFOR

FIELD OF THE INVENTION

The present invention relates to dynamic latching arrangements. More particularly, the present invention relates to a circuit arrangement and method for conditionally driving a dynamic latching arrangement to selectively generate a signal related to an input clock signal.

BACKGROUND OF THE INVENTION

Digital logic circuits may be classified by the type of logic they use. For example, one type, known as combinational or combinatorial logic, generates one or more outputs as a function only of the current input or inputs. By contrast, state logic circuits typically produce the output or outputs as a function of what is known as a present state vector. The present state vector is typically stored in storage elements. For example, the present state vector may be stored in flip-flops or magnetic storage media. Several factors typically influence the present state vector, such as the current input or inputs and the history of inputs.

State logic circuits typically include circuitry that generates what is known as a next state vector, which typically in turn determines the output or outputs generated. Like the present state vector, the next state vector is typically stored in storage elements.

State logic circuits can be further classified by the way in which they store the present and next state vectors. One type of state logic circuit, known as static logic, typically stores state vectors on arrays of memory elements, such as flip-flops. Another type, known as dynamic logic, typically stores information as electrical charges on points in the circuit known as nodes. Such nodes typically assume a high impedance state when they are not being updated. In such a state, the nodes can hold electrical charges.

State logic circuits are often designed for synchronous operation. Circuits of this type typically rely on clock signals to synchronize their operations. In such logic circuits, the output values are updated every time an effective edge or transition of the clock signal occurs. For some systems, the effective edge is defined as the positive edge of the clock signal. In circuits of this type, the output values are updated when the clock signal transitions from the low logic state to the high logic state. For other systems, the effective edge is defined as the negative edge of the clock signal. These systems have outputs whose values are updated when the clock signal transitions from the high logic state to the low logic state. A number of applications benefit from the ability to select between a clock signal and a signal related to the clock signal. For example, some applications benefit from the ability to generate a divided clock signal having a frequency lower than the clock signal. This capability is desirable, for example, for use in prescaling circuits.

Some clock division approaches use an edge-triggered flip-flop configured as a toggle to provide a divided clock signal. Approaches of this type typically also use a multiplexer to select between the original clock signal and the divided clock signal. The multiplexer increases the amount of chip real estate required, thereby increasing both the device size and the cost of manufacture. Furthermore, the additional level of logic imposes gate delays, resulting in slower overall speed. Power consumption is also increased unnecessarily because power is required to run the unused path. For example, if the original clock signal is selected, power is required to generate the divided clock signal even though the divided clock signal is not used. Conversely, if the divided clock signal is selected, power is required to run the original clock signal path. This waste of power is particularly significant in applications in which power must be used efficiently, such as portable computers and other battery-powered devices.

SUMMARY OF THE INVENTION

Generally, the present invention provides a circuit arrangement and method for conditionally driving a dynamic latching arrangement. Consistent with one aspect of the present invention, a circuit arrangement includes a dynamic latching arrangement that includes first and second state storing circuits, at least one of which has an internal node. The dynamic latching arrangement processes a clock signal and generates an output signal as a function of an internal signal stored on the internal node. The circuit arrangement further includes conditional driving circuitry that selectively impresses an alternate internal signal on the internal node such that the circuit arrangement generates an alternate output signal as a function of the alternate internal signal.

Consistent with another aspect of the present invention, a system incorporating the circuit arrangement is provided.

Consistent with another aspect of the invention, a circuit arrangement for selectively generating a clock signal or a divided clock signal in response to a control signal is provided. The circuit arrangement includes a first circuit that generates the divided clock signal and a second circuit that selectively impresses a signal related to an input clock signal on an internal node of the first circuit in response to the control signal.

Consistent with another aspect of the present invention, a method for selectively providing a clock signal or a divided clock signal is provided. The method involves presenting an input clock signal to a circuit and generating the divided clock signal. When a control signal is asserted, a signal related to the input clock signal is impressed on an internal node of the circuit.

Consistent with another aspect of the present invention, a method for selectively generating an output signal related to a clock signal is provided. The clock signal is provided to at least one dynamic latching arrangement. A signal is selectively impressed on an internal node of the latching arrangement.

The above summary of the present invention is not intended to describe each illustrated embodiment, or every implementation, of the present invention. This is the purpose of the figures and of the detailed description that follow.

BRIEF DESCRIPTION OF THE DRAWINGS

Various aspects and advantages of the invention will become apparent upon reading the following detailed description and upon reference to the drawings in which.

Figure 1:
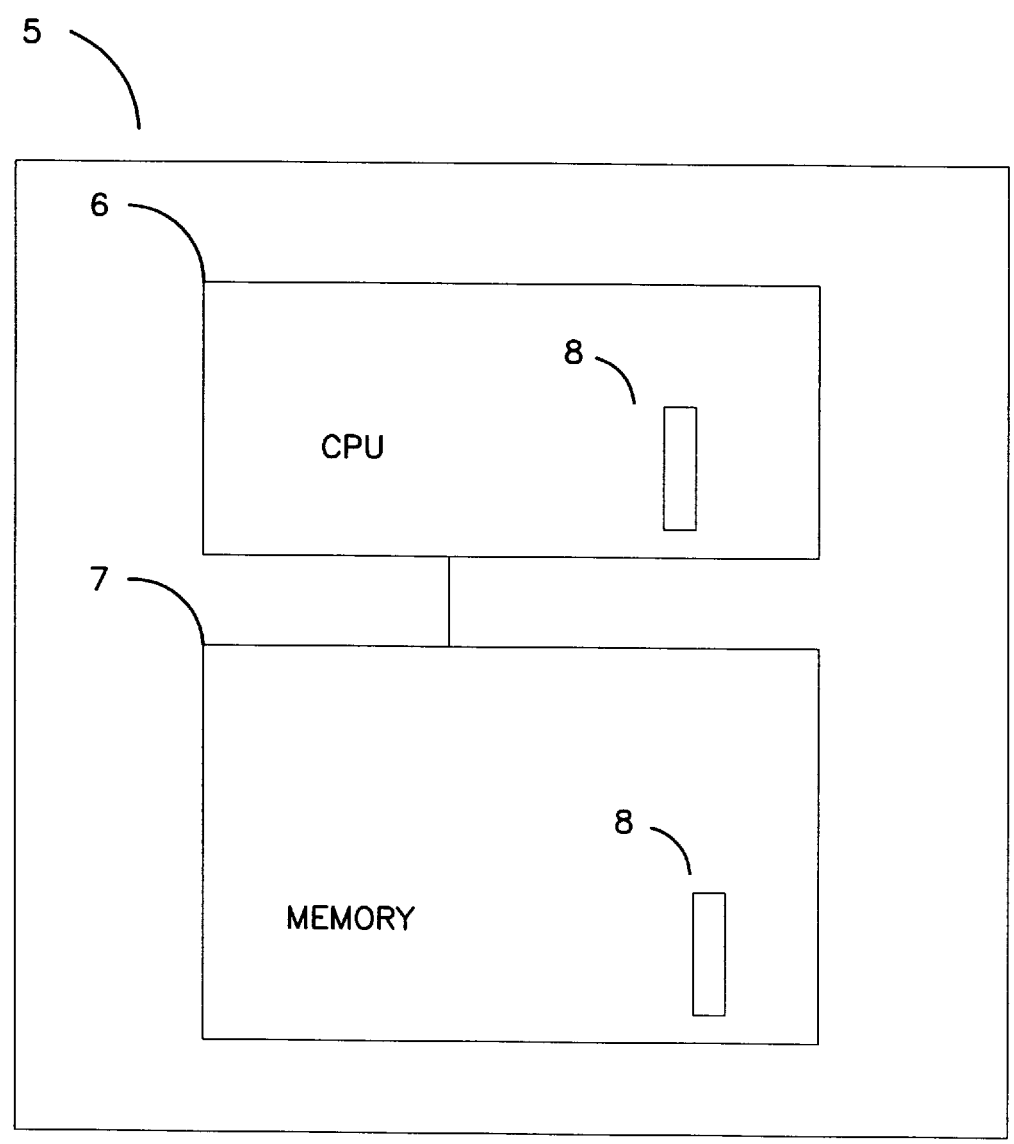
FIG. 1 illustrates in block diagram form a system consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DESCRIPTION OF THE ILLUSTRATED EMBODIMENTS

The present invention is believed to be applicable to dynamic logic circuits. Circuit arrangements consistent with the present invention have been found to be particularly advantageous in application environments in which it is desirable to selectively generate either a copy of an input clock signal or a divided clock signal. The illustrated embodiments take advantage of the high impedance present on dynamic logic nodes during portions of their cycles in order to conditionally impress a clock signal on the nodes. Thus, the multiplexer used by some approaches is eliminated, reducing the amount of logic required. As a result, the circuit arrangements are simpler and more compact than previous approaches. The reduction in logic also results in higher speed and lower power consumption.

Referring now to the drawings, FIG. 1 illustrates an exemplary system consistent with an embodiment of the invention. The system may be implemented, for example, as a computer 5. A central processing unit (CPU) 6 performs arithmetic and logic operations and includes, for example, an arithmetic logic unit and control circuitry. A memory 7, stores data used by the CPU 6, such as program instructions to be executed by the CPU 6. The memory 7 may include random access memory, read only memory, or both. The CPU 6 accesses data stored in the memory 7 using an address signal to select a location for storing data in the memory 7. A dynamic latching arrangement 8 (discussed in greater detail below), is utilized in the CPU 6, the memory 7, or both.

Figure 2:
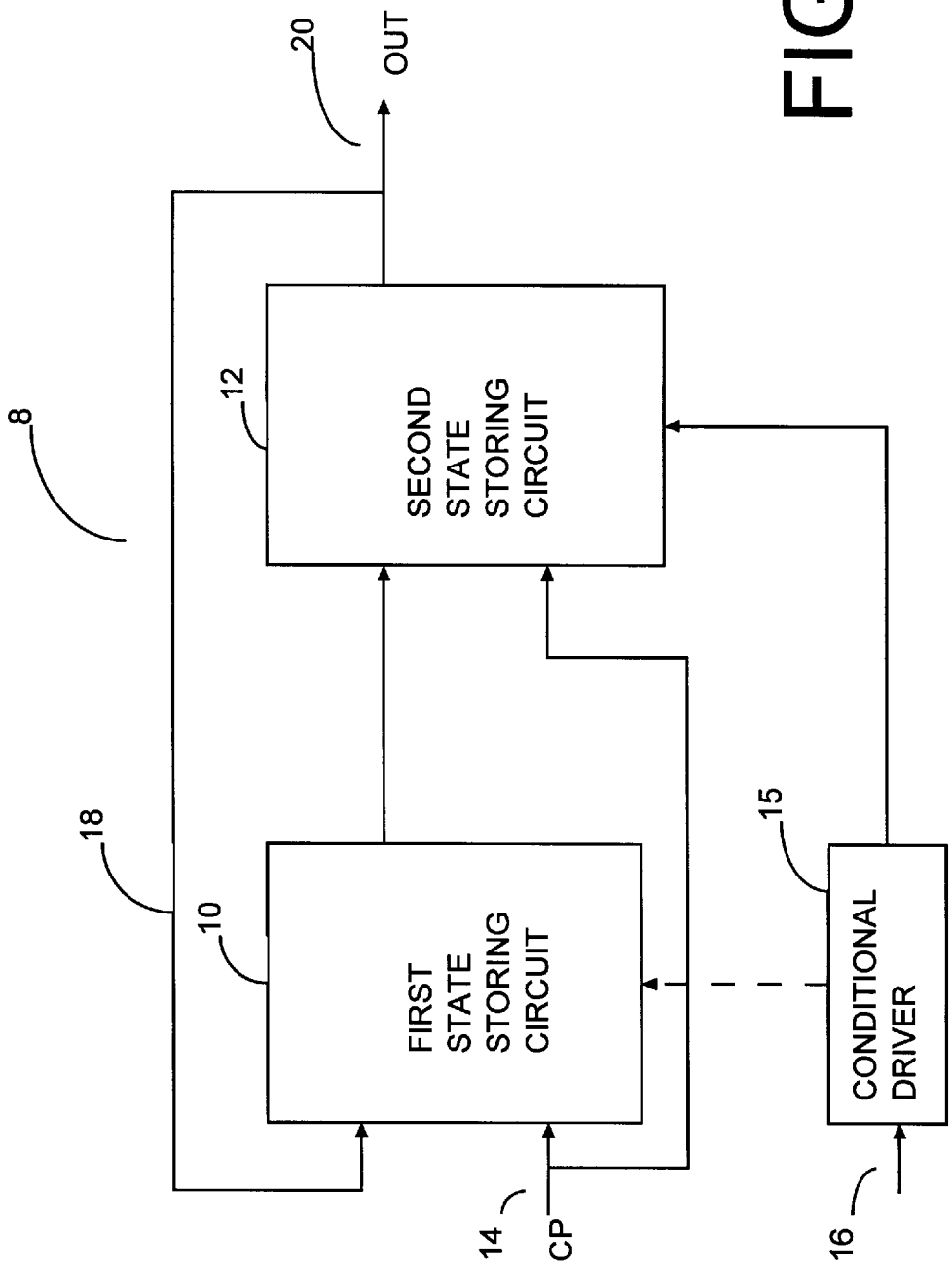
FIG. 2 illustrates in block diagram form a circuit arrangement consistent with an embodiment of the present invention.

FIG. 2 shows in block diagram form a dynamic latching arrangement 8 consistent with the invention. The dynamic latching arrangement has an input stage 10 and an output stage 12. The output stage 12 receives a control signal from an input terminal 16. Both stages 10 and 12 receive a clock signal CP from an input terminal 14. The clock signal CP is typically a square wave with a high logic state and a low logic state, alternating between the two states with a period $T_0$ and a frequency $f_0 = 1/T_0$.

The input stage 10 employs a feedback loop 18 to receive as input a signal OUT from the output stage 12 when the clock signal CP is at one logic state. A copy of the signal OUT is provided to the output stage 12 when the clock signal CP enters the other logic state. A conditional driver 15 is configured and arranged such that, when the control signal is active, a signal related to the clock signal CP is impressed on an internal node, such as a node $N_4$, of the latching arrangement 8 due to the high impedance on the internal node. For example, the impressed signal may be a logical complement of the clock signal CP. Assuming such a signal is impressed on the internal node of the latching arrangement 8, a copy of the clock signal CP is generated as the signal OUT. When, on the other hand, the control signal is not active, the conditional driver 15 impresses no signal on the internal node. Instead, the output stage 12 changes its logic state at the positive edge of the clock signal CP. The positive edge occurs, and the state of the output stage 12 changes, once every two transitions of the clock signal CP. As a result, the signal OUT is a square wave with a period $T_1$ equal to twice $T_0$ and a frequency $f_1 = 1/T_1 = f_0/2$.

Figure 3:
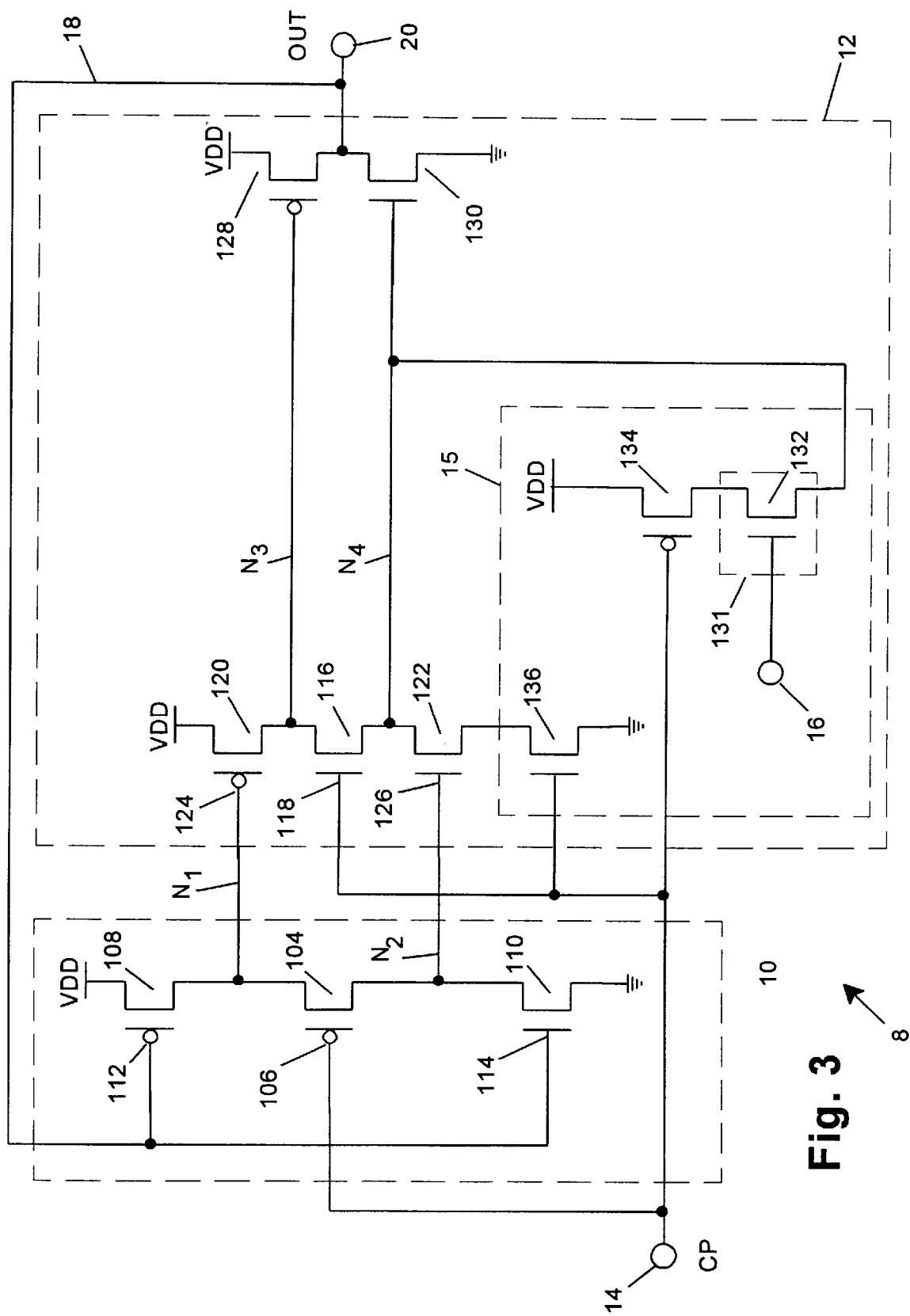
FIG. 3 is a schematic diagram illustrating in greater detail a circuit arrangement consistent with an embodiment of the present invention.
Figure 4A:
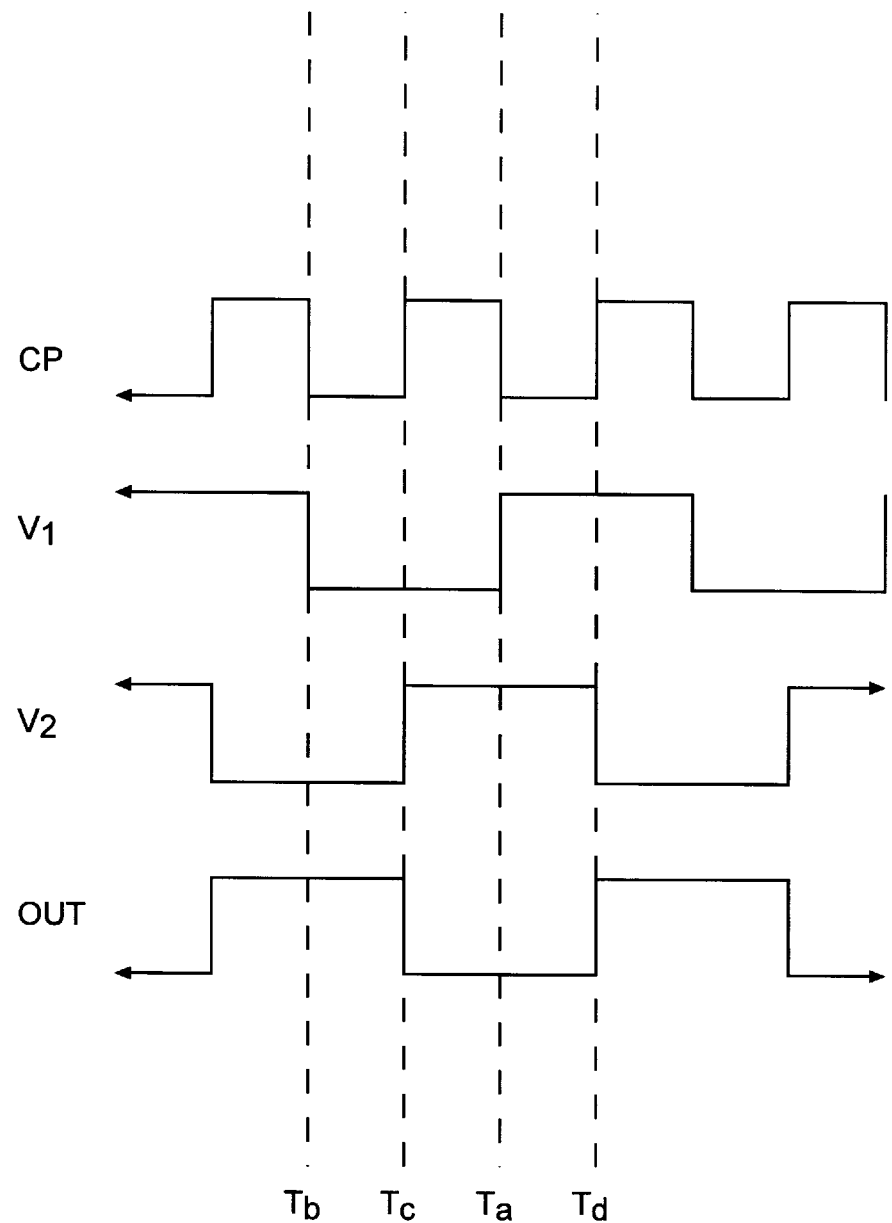
FIGS. 4A and 4B are timing diagrams illustrating various waveforms generated in a circuit arrangement consistent with an embodiment of the present invention.
Figure 4B:
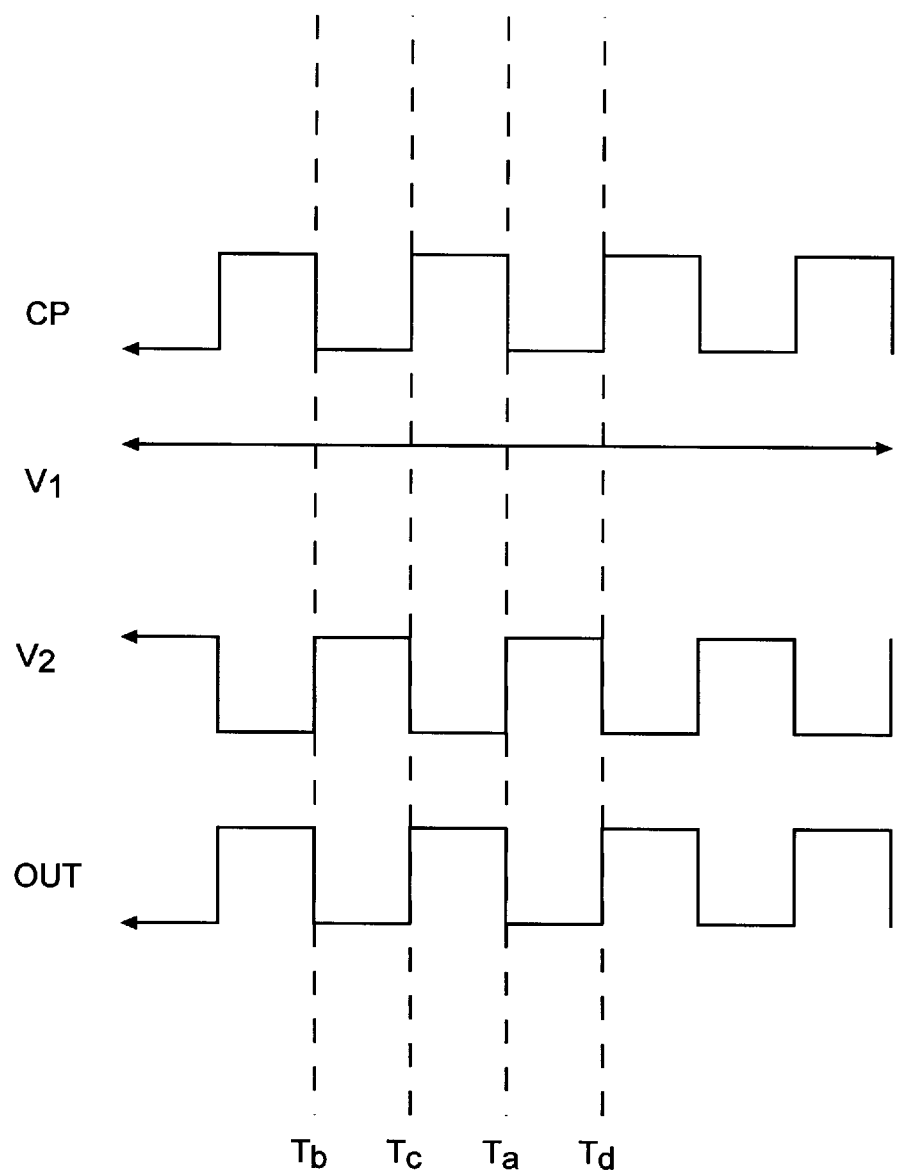

One particular embodiment of the latching arrangement 8 is illustrated in FIG. 3. Discussion of the operation of this embodiment of the latching arrangement 8 is facilitated by reference to the timing diagrams of FIGS. 4A and 4B, which respectively illustrate waveforms generated in modes of operation in which the control signal is inactive and active. In the illustrated configuration, the input stage 10 is active during the low logic phase of the clock cycle, and the output stage 12 is active during the high logic phase of the clock cycle. Each stage samples a signal during its active phase. When the clock signal CP is low, the input stage 10 samples the signal OUT provided by the output stage 12 through the feedback loop 18. When the clock signal CP transitions to the high logic state, the output stage 12 samples the output from the input stage 10 and changes its state accordingly.

The input stage 10 is configured and arranged to receive an input signal when it is activated by an input stage clock device 104. The input stage clock device 104 may be implemented, for example, as a P-type MOSFET. Assuming the input stage clock device 104 is implemented as a P-type MOSFET, the input stage 10 receives the input signal when the clock signal CP is in the low logic state. In this embodiment, the input stage receives the signal OUT from the output stage 12 through the feedback loop 18. A gate terminal 106 of the input stage clock device 104 is responsive to the clock signal CP. A pair of transistors 108 and 110 is configured to invert the signal OUT provided to their respective gate terminals 112 and 114 through the feedback loop 18. For example, the transistor 108 may be implemented as a P-type MOSFET coupled to a power supply $V_{DD}$, and the transistor 110 may be implemented as a grounded N-type MOSFET. When the clock signal CP transitions to the low logic state, the input stage clock device 104 enters the conducting mode. If the signal OUT is also low as illustrated at a time $T_a$ in FIG. 4A, the transistor 108 pulls a voltage $V_1$ at the nodes $N_1$ and $N_2$ up to $V_{DD}$, placing the input stage 10 in the high logic state. If, as illustrated at a time $T_b$ in FIG. 4A, the signal OUT is high, the transistor 110 pulls the voltage $V_1$ down to ground, placing the input stage 10 in the low logic state.

The output stage 12 generates the signal OUT based on the signal received from the input stage 10 and on the state of the control signal. An output stage clock device 116 activates the output stage 12 when the clock signal CP assumes a preselected logic state. For example, in the illustrated embodiment, the output stage clock device 116 activates the output stage 12 on the positive edge of the clock signal CP. Assuming the output stage 12 is positive edge-triggered, the output stage clock device 116 is implemented as an N-type MOSFET. A gate terminal 118 of the output stage clock device 116 is responsive to the clock signal CP. The transistors 120 and 122 are configured and arranged to invert the signal provided to their respective gate terminals 124 and 126 from the nodes $N_1$ and $N_2$. For example, the transistor 120 may be implemented as a P-type MOSFET coupled to the power supply $V_{DD}$, and the transistor 122 may be implemented as a grounded N-type MOSFET. On the positive edge of the clock signal CP, the output stage clock device 116 enters the conducting mode. If the input stage 10 is in the low logic state, as illustrated at a time $T_c$ in FIG. 4A, the gate terminal 124 of the transistor 120 is grounded through the input stage clock device 104 and the transistor 108. Consequently, the transistor 120, along with the output stage clock device 116, pulls a voltage $V_2$ at the nodes $N_3$ and $N_4$ up to $V_{DD}$. If, as illustrated at a time $T_d$ in FIG. 4A, the input stage 10 is in the high logic state, the gate terminal 126 of the transistor 122 is coupled through the input stage clock device 104 and the transistor 106 to $V_{DD}$. As a result, the transistor 120 pulls the voltage $V_2$ down to ground. A pair of transistors 128 and 130 is similarly configured and arranged to provide an additional inversion to generate the signal OUT, which is provided to the gate terminals 112 and 114 of the transistors 106 and 108 of the input stage 10 through the feedback loop 18. Because the positive edge of the clock signal CP occurs once per cycle of the clock signal CP (i.e., once for every two transitions), the signal OUT changes its state once for every two transitions of the clock signal CP. Thus, the circuit generates an output square waveform with half the frequency of the clock signal CP.

Additional circuitry is configured and arranged to allow a signal related to the clock signal CP to be impressed on an internal node of the latching arrangement 8 such that the signal OUT is a copy of the clock signal CP rather than a divided clock signal. For example, in the illustrated embodiment, the conditional driver 15 selectively impresses the node $N_4$ with a logical complement of the clock signal CP. A control device 131 is responsive to the control signal from the control input terminal 16. The control device may be implemented, for example, as a transistor 132. In the illustrated embodiment, the transistor 132 is implemented as an N-type MOSFET. However, it will be appreciated by those skilled in the art that a different type of component, such as a P-type MOSFET, may be selected to implement the control device. A transistor 134 is responsive to the clock signal CP. When the control signal and the clock signal CP are low, transistors 116, 132, and 136 are in the nonconducting mode. The node $N_4$ is thus placed in a state of high impedance and retains its previous state. The transistor 134 is decoupled from the node $N_4$, and the logical complement of the clock signal CP is not impressed on the node $N_4$. Consequently, the circuit generates a divided clock signal, which is provided at the output terminal 20.

When the control signal is high, the transistor 132 is in the conducting mode and couples the transistor 134 to the node $N_4$. If the clock signal CP is low, as illustrated at the times $T_a$ and $T_b$ in FIG. 4B, the transistor 134 acts as a pull-up resistor, pulling the voltage $V_2$ at the node $N_4$ up to $V_{DD}$. The transistor 136, which is in the nonconducting mode when the clock signal CP is low, maintains the node $N_4$ in a high impedance state. Because transistors 128 and 130 invert the state produced at $N_4$, the signal OUT is low. If, as illustrated at the times $T_c$ and $T_d$ in FIG. 4B, the clock signal CP is high, the transistor 136 acts as a pull-down resistor, pulling the voltage $V_2$ at the node $N_4$ down to ground. The transistor 134 is in the nonconducting mode, such that the node $N_4$ is not coupled to $V_{DD}$. The pair of transistors 128 and 130 produce another level of inversion so that the signal OUT is high. As a result, when the control signal is high, the signal OUT has the same frequency as the clock signal CP.

While the present invention has been described in connection with the exemplary embodiments thereof, it will be understood that many modifications will be readily apparent to those skilled in the art. A relatively small modification is to, for example, implement the transistor 132 as a P-type MOSFET. This variation would yield a circuit that provides a copy of the input clock signal when the control signal is low and the divided clock signal when the control signal is high. Furthermore, the conditional driver 15 may be coupled to the input stage 10 rather than to the output stage 12. These and other modifications to the illustrated embodiments are intended to fall within the scope of the present invention, as set forth in the following claims.

What is claimed is:

1. A circuit arrangement, comprising:
    a dynamic latching arrangement, including a first state storing circuit including an internal node configured to store an internal signal, the dynamic latching arrangement configured and arranged to process a clock signal and generate the internal signal therefrom, and to generate at an output node an output signal as a function of the internal signal; and
    a conditional driver, responsive to the clock signal, the conditional driver configured and arranged to, in response to a control signal, selectively impress on the internal node an alternate internal, such that the dynamic latching arrangement generates at the output node an alternate output signal as a function of the alternate internal signal.

2. A circuit arrangement according to claim 1, wherein the alternate internal signal is a logical complement of the clock signal.

3. A circuit arrangement according to claim 1, further including a second state storing circuit coupled to the first state storing circuit and wherein the first state storing circuit is configured and arranged to respond from the second state storing circuit when the clock signal is at a first logic state and the second state storing circuit is configured and arranged to sample a logical complement of the output signal when the clock signal is at a second logic state.

4. A circuit arrangement according to claim 3, wherein the first state storing circuit comprises:
    a clock device that activates the first state storing circuit in response to the clock signal; and
    a transistor circuit coupled to the clock device and configured and arranged to sample the output signal in response to the clock signal.

5. A circuit arrangement according to claim 4, wherein the clock device is a field-effect transistor.

6. A circuit arrangement according to claim 4, wherein the transistor circuit comprises a first field-effect transistor of a first conductivity type and a second field-effect transistor of a second conductivity type opposite to the first conductivity type.

7. A circuit arrangement according to claim 3, wherein the second state storing circuit comprises:
    a clock device that activates the second state storing circuit in response to the clock signal;
    a first plurality of transistors, coupled to the clock device and configured and arranged to sample the logical complement of the output signal in response to the clock signal; and
    a second plurality of transistors, coupled to the clock device and to the first plurality of transistors configured and arranged to provide the output signal.

8. A circuit arrangement according to claim 7, wherein the clock device is a field-effect transistor.

9. A circuit arrangement according to claim 7, wherein the first plurality of transistors comprises a first field-effect transistor of a first conductivity type and a second field-effect transistor of a second conductivity type opposite to the first conductivity type.

10. A circuit arrangement according to claim 7, wherein the second plurality of transistors comprises a first field-effect transistor of a first conductivity type and a second field-effect transistor of a second conductivity type opposite to the first conductivity type.

11. A circuit arrangement according to claim 1, wherein the conditional driver comprises:
a first field-effect transistor configured and arranged to receive the control signal; and
a plurality of transistors, responsive to said clock signal, configured and arranged to impress the alternate internal signal on the internal node.

12. A circuit arrangement for selectively providing a clock signal or a divided clock signal having a period equal to an integral multiple of a period of the clock signal at an output node in response to a control signal, the circuit arrangement comprising:
a clock input, responsive to an input clock signal;
a control input, responsive to the control signal;
a first circuit, configured and arranged to generate the divided clock signal at the output node, the divided clock signal having a period equal to an integral multiple of a period of the input clock signal; and
a second circuit, configured and arranged such that a first signal having a frequency and phase related to the input clock signal is impressed on an internal node of the first circuit in response to the control signal being asserted such that the first circuit generates an alternate clock signal at the output node, the alternate clock signal having a period equal to the input clock signal.

13. A circuit arrangement according to claim 12, wherein the first signal is a logical complement of the input clock signal.

14. A circuit arrangement according to claim 12, wherein the first circuit comprises first and second state storing circuits capable of selectively assuming one of two logic states.

15. A circuit arrangement according to claim 14, wherein the first state storing circuit is configured and arranged to assume a logic state in response to a first logic state of the input clock signal, and the second state storing circuit is configured and arranged to assume the logic state of the first state storing circuit when the clock signal is at a second logic state.

16. A circuit arrangement according to claim 15, wherein the first state storing circuit comprises:
a first transistor having a first terminal coupled to a voltage supply, a gate terminal coupled to the output node, and a second terminal coupled to a first node;
a second transistor having a first terminal coupled to the first node, a gate terminal responsive to the clock signal, and a second terminal coupled to a second node; and
a third transistor having a first terminal coupled to the second node, a gate terminal coupled to the output node, and a grounded second terminal.

17. A circuit arrangement according to claim 16, wherein the second state storing circuit comprises:
a fourth transistor having a first terminal coupled to the voltage supply, a gate terminal coupled to the first node, and a second terminal coupled to a third node;
a fifth transistor having a first terminal coupled to the third node, a gate terminal responsive to the clock signal, and a second terminal coupled to a fourth node;
a sixth transistor having a first terminal coupled to the fourth node, a gate terminal coupled to the second node;
a seventh transistor having a first terminal coupled to the voltage supply, a gate terminal coupled to the third node, and a second terminal coupled to the output node; and an eighth transistor having a first terminal coupled to the output node, a gate terminal coupled to the fourth node, and a grounded second terminal.

18. A circuit arrangement according to claim 17, wherein the first, second, fourth, and seventh transistors are field-effect transistors of a first conductivity type and the third, fifth, sixth, and eighth transistors are field-effect transistors of a second conductivity type opposite to the first conductivity type.

19. A circuit arrangement according to claim 12, wherein the first circuit comprises:
a first transistor having a first terminal coupled to the voltage supply, a gate terminal coupled to the output node, and a second terminal coupled to a first node;
a second transistor having a first terminal coupled to the first node, a gate terminal responsive to the clock signal, and a second terminal coupled to a second node;
a third transistor having a first terminal coupled to the second node, a gate terminal coupled to the output node, and a grounded second terminal;
a fourth transistor having a first terminal coupled to the voltage supply, a gate terminal coupled to the first node, and a second terminal coupled to a third node;
a fifth transistor having a first terminal coupled to the third node, a gate terminal responsive to the clock signal, and a second terminal coupled to a fourth node;
a sixth transistor having a first terminal coupled to the fourth node, a gate terminal coupled to the second node;
a seventh transistor having a first terminal coupled to the voltage supply, a gate terminal coupled to the third node, and a second terminal coupled to the output node and to the first and third transistors; and
an eight transistor having a first terminal coupled to the output node and to the first and third transistors, a gate coupled to the fourth node, and a grounded second terminal.

20. A circuit arrangement according to claim 19, wherein the first, second, fourth, and seventh transistors are field-effect transistors of a first conductivity type and the third, fifth, sixth, and eighth transistors are field-effect transistors of a second conductivity type.

21. A circuit arrangement according to claim 19, wherein the second circuit comprises:
a ninth transistor having a first terminal coupled to a second terminal of the sixth transistor, a gate terminal responsive to the clock signal, and a grounded second terminal;
a tenth transistor having a first terminal coupled to the voltage supply, a gate terminal responsive to the clock signal, and a second terminal; and
an eleventh transistor having a first terminal coupled to the second terminal of the tenth transistor, a gate terminal responsive to the control signal, and a second terminal coupled to the fourth node.

22. A circuit arrangement according to claim 21, wherein the ninth and eleventh transistors are field-effect transistors of a same conductivity type as the third, fifth, sixth, and eighth transistors and the tenth transistor is a field-effect transistor of a same conductivity type as the first, second, fourth, and seventh transistors.

23. A method for selectively providing a clock signal or a divided clock signal having a period equal to an integral multiple of a period of the clock signal, the method comprising:

presenting an input clock signal to a circuit arrangement having an output node and a control terminal configured and arranged to receive a control signal;

generating a divided clock signal at the output node;

selectively asserting the control signal; and in response to the control signal, impressing a first signal having a frequency and phase related to the input clock signal on an internal node of the circuit arrangement such that an undivided clock signal is generated at the output node, the undivided clock signal having a period equal to the input clock signal.

24. A method according to claim 23, wherein the first signal is a logical complement of the input clock signal.

25. A method according to claim 23, wherein generating the divided clock signal at the output node includes sampling the divided clock signal and generating a second signal that is provided as the divided clock signal.

26. A method according to claim 25, wherein the second signal is a delayed logical complement of the divided clock signal.

27. A method according to claim 25, wherein the divided clock signal is sampled by a first circuit and the second signal is generated by a second circuit.

28. A method according to claim 27, wherein sampling the divided clock signal comprises:

activating the first circuit in response to the input clock signal with a clock device; and sampling the divided clock signal in response to the input clock signal with a plurality of transistors.

29. A method according to claim 28, wherein the clock device is a field-effect transistor.

30. A method according to claim 28, wherein the plurality of transistors comprises a first field-effect transistor of a first conductivity type and a second field-effect transistor of a second conductivity type opposite to the first conductivity type.

31. A method according to claim 27, wherein generating the second signal comprises:

activating the second circuit in response to the input clock signal with a clock device;

sampling a third signal provided by the first circuit in response to the input clock signal with a first plurality of transistors;

inverting the third signal with a second plurality of transistors; and providing the third signal inverted as the second signal to the first circuit.

32. A method according to claim 31, wherein the clock device is a field-effect transistor.

33. A method according to claim 31, wherein the first plurality of transistors comprises a first field-effect transistor of a first conductivity type and a second field-effect transistor of a second conductivity type opposite to the first conductivity type.

34. A method according to claim 31, wherein the second plurality of transistors comprises a first field-effect transistor of a first conductivity type and a second field-effect transistor of a second conductivity type opposite to the first conductivity type.

35. A method according to claim 23, wherein impressing the first signal on the internal node of the circuit arrangement comprises:

selectively activating a conditional driving circuit in response to the control signal with a control device;

sampling the input clock signal in response to the control signal with a plurality of transistors; and with the plurality of transistors, selectively providing first signal to the internal node of the circuit arrangement.

36. A method according to claim 35, wherein the control device comprises a field-effect transistor.

37. A method according to claim 35, wherein the plurality of transistors comprises a first field-effect transistor of a first conductivity type and a second field-effect transistor of a second conductivity type opposite to the first conductivity type.

38. A method for selectively generating an output signal related to a clock signal, the method comprising:

providing the clock signal to at least one dynamic latching arrangement having an output node and an internal node;

storing an internal signal on the internal node;

generating an output signal as a function of the internal signal at the output node;

in response to a control signal, selectively impressing an alternate internal signal on the internal node; and when the alternate internal signal is impressed on the internal node, generating an alternate output signal at the output node as a function of the alternate internal signal.

39. A method according to claim 38, wherein the alternate internal signal is a logical complement of the clock signal.

40. A method according to claim 38, wherein the output signal has a period equal to a integral multiple of a period of the clock signal.

an eighth transistor having a first terminal coupled to the output node and to the first and third transistors, a gate terminal coupled to grounded second terminal.

41. A system comprising:

a dynamic latching arrangement, including a storing circuit including an internal node configured to store an internal signal, the dynamic latching arrangement configured and arranged to process a clock signal and generate the internal signal therefrom, and to generate at an output node an output signal as a function of the internal signal; and a conditional driver, responsive to the clock signal, the conditional driver configured and arranged to, in response to a control signal, selectively impress on the internal node an alternate internal signal having a frequency and phase that is a function of the clock signal such that the dynamic latching arrangement generates at the output node an alternate output signal as a function of the alternate internal signal.

* * * * *

UNITED STATES PATENT AND TRADEMARK OFFICE
CERTIFICATE OF CORRECTION

PATENT NO. : 5,828,249

DATED : October 27, 1998

INVENTOR(S) : Sessions

It is certified that error appears in the above-identified patent and that said Letters Patent is hereby corrected as shown below:

On the title page
In the heading, the application number should read: 08/762,770.

Col. 6, line 26: "from" should read --to--.

Col. 8, line 35: "eight" should read --eighth--.

Col. 8, lines 36-37: "gate coupled" should read --gate terminal coupled--.

Signed and Sealed this

Twenty-fourth Day of April, 2001

*Attest:*

NICHOLAS P. GODICI

*Attesting Officer*    *Acting Director of the United States Patent and Trademark Office*